(12) United States Patent
Asano et al.

(10) Patent No.: US 8,062,460 B2
(45) Date of Patent: Nov. 22, 2011

(54) LAMINATED PIEZOELECTRIC CERAMIC ELEMENT MANUFACTURING METHOD

(75) Inventors: Hiroshi Asano, Moriyama (JP); Katsuhiro Horikawa, Omihachiman (JP); Masachika Takata, Yasu (JP); Masanori Kato, Higashiomi (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

(21) Appl. No.: 12/905,400

(22) Filed: Oct. 15, 2010

(65) Prior Publication Data

US 2011/0024033 A1 Feb. 3, 2011

Related U.S. Application Data

(63) Continuation of application No. PCT/JP2009/000952, filed on Mar. 3, 2009.

(30) Foreign Application Priority Data

Apr. 18, 2008 (JP) ................................. 2008-109310

(51) Int. Cl.
*B32B 37/02* (2006.01)
*B32B 38/04* (2006.01)

(52) U.S. Cl. ..................... 156/264; 156/89.12; 156/512; 29/25.35

(58) Field of Classification Search .................. 156/254, 156/264, 89.12, 512; 29/25.35
See application file for complete search history.

(56) References Cited

FOREIGN PATENT DOCUMENTS

| JP | 7-094359 A | 4/1995 |
|---|---|---|
| JP | 07-142780 A | 6/1995 |
| JP | 2001-230463 A | 8/2001 |
| JP | 2002-314161 A | 10/2002 |
| JP | 2006-108351 A | 4/2006 |
| JP | 2006-324538 A | 11/2006 |

OTHER PUBLICATIONS

Written Opinion of the International Searching Searching Authority, mailed Apr. 7, 2009.

*Primary Examiner* — Linda L Gray
(74) *Attorney, Agent, or Firm* — Dickstein Shapiro LLP (57) ABSTRACT

There is provided a laminated piezoelectric ceramic element manufacturing method, wherein, even when the number of internal electrode laminations is increased, the lamination and cutting steps can be simplified, to enhance cutting precision and make cutting cost low. A first laminated body having stripe-like internal electrodes is cut into a plurality of second laminated bodies so as to have a width-direction dimension W corresponding to a width dimension of a laminated piezoelectric ceramic element chip to be ultimately obtained. Two or more second laminated bodies are laminated in the laminating direction to obtain a third laminated body, and the third laminated body is cut in the laminating direction and parallel to the width direction W to obtain a laminated piezoelectric body.

9 Claims, 9 Drawing Sheets

LAMINATED PIEZOELECTRIC CERAMIC ELEMENT MANUFACTURING METHOD

This is a continuation of application Serial No. PCT/jp2009/000952, filed Mar. 3, 2009, the contents of which are incorporated herein by reference.

TECHNICAL FIELD

The present invention relates to a laminated piezoelectric ceramic element manufacturing method used for a laminated piezoelectric resonator, a laminated piezoelectric filter and the like, and more specifically, the present invention relates to a laminated piezoelectric ceramic element manufacturing method including a step of cutting a mother laminated body and a step of obtaining individual laminated piezoelectric bodies for laminated piezoelectric ceramic elements.

BACKGROUND ART

There has previously been used a laminated piezoelectric actuator for driving a head of a hard disc drive, a head of a printer, and the like.

The number of internal electrodes in the laminated piezoelectric actuators have been on the increase, to obtain a larger amount of displacement. Further, a piezoelectric body layer between the internal electrodes is increasingly reduced in thickness for advancing miniaturization. In the case of reducing the thickness of a piezoelectric body layer between internal electrodes and increasing the number of internal electrode laminations, enhancing the conventional adhesion between the internal electrodes and the piezoelectric body layer has tended to be difficult even when the laminated piezoelectric body is crimped in a laminating direction before baking.

Therefore, Patent Document 1 proposes a laminated piezoelectric body manufacturing method described below.

Figure 13A:
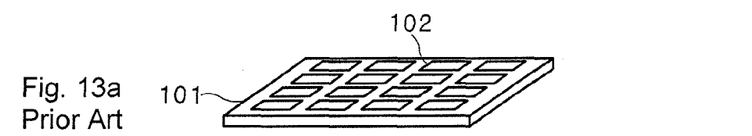
FIGS. 13(a) to 13(f) are perspective views each showing an example of a manufacturing method for a conventional laminated piezoelectric body.
Figure 13B:
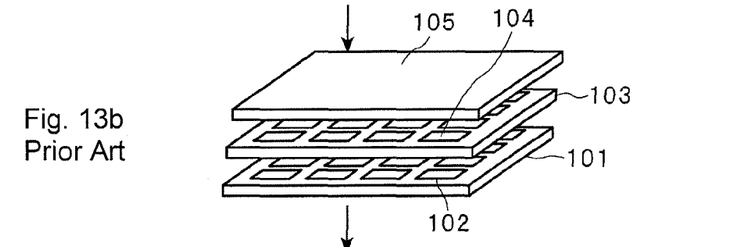
Figure 13C:
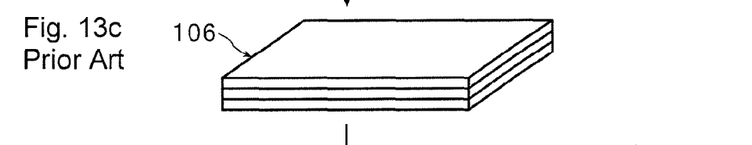

As shown in FIGS. 13(a) to 13(f), first, a rectangular mother ceramic green sheet 101 is prepared in the manufacturing method described in Patent Document 1. A mother internal electrode pattern 102 is formed on the mother ceramic green sheet 101. The mother ceramic green sheet 101, on which the internal electrode pattern 102 is formed, and a mother ceramic green sheet 103, on the upper surface of which an internal electrode pattern 104 is formed displaced from the internal electrode pattern 102, are alternately laminated as shown in FIG. 13(b). One mother ceramic green sheet 101 and one mother ceramic green sheet 103 are alternately laminated in FIG. 13(b), but in practice, larger numbers of mother ceramic green sheets 101 and mother ceramic green sheets 103 are alternately laminated.

Moreover, a solid mother ceramic green sheet 105 is laminated. These mother ceramic green sheets 101, 103, 105 are laminated and pressed in a thickness direction, to obtain a first crimped body 106 shown in FIG. 13(c).

Figure 13D:
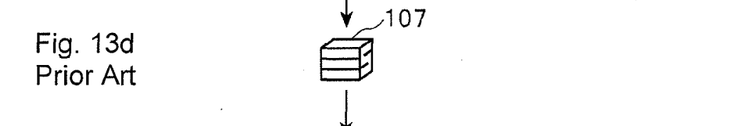

Next, the first crimped body 106 is cut in the thickness direction so as to have individual planar shapes of the laminated piezoelectric body. In such a manner, a chip 107 shown in FIG. 13(d) is obtained. The chip 107 has the same planar shape as that of the laminated piezoelectric body to be ultimately manufactured, but the number of internal electrode laminations is far smaller than the number of laminations of the ultimately manufactured laminated piezoelectric body. Hence, the internal electrodes 102, 104 and the piezoelectric body layers in chip 107 are tightly attached.

Figure 13E:
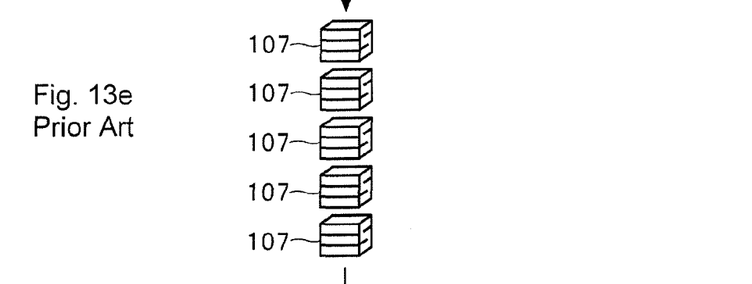
Figure 13F:
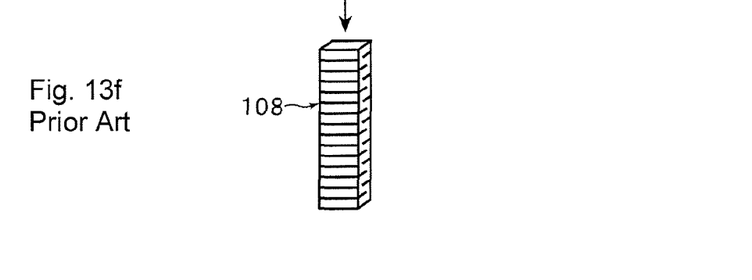

Thereafter, as shown in FIG. 13(e), a plurality of chips 107 are laminated in a laminating direction, followed by heating and pressing to obtain a laminated raw chip 108 shown in FIG. 13(f). At the time of obtaining the laminated raw chip 108, the number of plurality of chips 107 is selected such that the number of internal electrode laminations in the laminated raw chip 108 is the same as the number of internal electrode laminations in the laminated piezoelectric body to be ultimately manufactured.

The laminated raw chip 108 as thus obtained is heated to decompose binder, and then baked, so that a laminated piezoelectric body can be obtained. In the obtained laminated piezoelectric body, peeling between the internal electrodes and the piezoelectric body layers are hard to occur since the internal electrodes and the ceramic green sheets are tightly attached at the stage of the chips 107.

Patent Document 1: Japanese Unexamined Patent Publication No. 2002-314161

DISCLOSURE OF THE INVENTION

However, the manufacturing method described in Patent Document 1 is highly complicated. More specifically, it has been necessary, after obtainment of the first crimped body 106, to perform bidirectional cutting in the thickness direction for cutting out the chips 107. It has also been necessary to perform the lamination step for obtaining the first crimped body 106, and further to laminate the plurality of chips 107 for obtaining the laminated raw chip 108. Moreover, at the time of laminating the plurality of chips 107, the positioning thereof has been highly complicated since the chips 107 are small in size.

Normally, for reducing the number of laminations of the chips 107, namely, for facilitating the operation in the step of laminating the plurality of chips 107, chip 107 is made to have considerably small width and depth dimensions as compared with a dimension in the thickness direction, i.e., the height direction. However, at the time of cutting the first crimped body 106, it has been necessary to cut the first crimped body 106 in the thickness direction of the chip 107. It has thus been difficult to cut the first crimped body 106 into the chips 107 with high precision.

Further, due to the necessity to cut the first crimped body 106 having a considerably large thickness, it has been difficult to reduce the thickness of a cutting blade for use at the time of cutting. It has thus been difficult to increase the number of chips 107 obtained from the first crimped body 106.

An object of the present invention is to solve the above drawbacks of the conventional art, and to provide a laminated piezoelectric ceramic element manufacturing method in which the cutting step and the lamination step can be simplified, and further, the cutting can be performed with high precision with use of a cutting blade thinner than the conventional cutting blade even when the number of internal electrode laminations is increased.

According to the present invention, there is provided a laminated piezoelectric ceramic element manufacturing method, including the steps of: preparing a first laminated body that has a plurality of piezoelectric body layers mainly made of piezoelectric ceramic, and stripe-like internal electrodes disposed on at least one interface between the mutually adjacent piezoelectric body layers in the plurality of piezoelectric body layers; cutting the first laminated body in the laminating direction so as to have a width-direction dimension corresponding to a width dimension of a laminated piezoelectric body to be ultimately obtained after cutting, to obtain a plurality of second laminated bodies having the width-direction dimension; laminating two or more laminated bodies in the laminating direction of the piezoelectric body layers, to obtain a third laminated body; providing a joint material so as to cross among the mutually adjacent second laminated bodies in the third laminated body in order to temporarily bond the laminated second laminated bodies to one another; cutting the third laminated body in the laminating direction and in a direction parallel to the width direction of the second laminated body, to obtain a laminated piezoelectric body; and baking the laminated piezoelectric body.

In a specific aspect of the laminated piezoelectric ceramic element manufacturing method according to the present invention, when cutting the first laminated body to obtain the plurality of second laminated bodies, the first laminated body is cut in a direction parallel to the length direction of the stripe-like internal electrode formed in the first laminated body, so as to have a rectangular planar shape with a pair of opposed sides having the width-direction dimension. In this case, it is possible, to perform the cutting without regard to positions of the internal electrodes at the time of cutting the third laminated body.

In another specific aspect of the laminated piezoelectric ceramic element manufacturing method according to the present invention, when cutting the first laminated body to obtain the plurality of second laminated bodies, the first laminated body is cut in a direction orthogonal to a length direction of the stripe-like internal electrode formed in the first laminated body, so as to have a rectangular planar shape with a pair of opposed sides having the width-direction dimension. In this case, it is possible, to perform the cutting while visually recognizing the positions of the internal electrodes at the time of cutting the third laminated body. It is thereby possible to obtain the laminated body with the electrodes thereof having high positional precision.

In yet another specific aspect of the laminated piezoelectric ceramic element manufacturing method according to the present invention, an adhesive is used as the joint material, and in that case, it is possible to temporarily bond the plurality of second laminated bodies with ease only by applying the adhesive onto the outer surface of the third laminated body.

In another specific aspect of the laminated piezoelectric ceramic element manufacturing method according to the present invention, an adhesive sheet or a bonding sheet is used as the joint material. In this case, it is possible to temporarily bond with ease the plurality of second laminated bodies only by pasting the adhesive sheet or the bonding sheet onto the outer surface of the third laminated body after obtainment of the third laminated body.

EFFECTS OF THE INVENTION

According to the laminated piezoelectric ceramic element manufacturing method according to the present invention, the first laminated body is cut so as to obtain a plurality of second laminated bodies having the above width-direction dimension, the plurality of second laminated bodies are further laminated to obtain the third laminated body, and the third laminated body is cut in the laminating direction and parallel to the width-direction dimension, to obtain the laminated piezoelectric body, whereby it is possible to simplify the lamination step and the cutting step.

In the manufacturing method described in Patent Document 1, a plurality of small chips need to be laminated in the laminating direction, thus making the lamination step complicated, and particularly making positioning at the time of lamination complicated. As opposed to this, it is possible to omit the complicated operation of laminating the plurality of chips according to the present invention in consideration of mutual positional relations of the internal electrodes.

Furthermore, the third laminated body may be cut in the direction parallel to the width direction in the cutting step after lamination of all the internal electrodes, namely the cutting length is the same as the width-direction dimension, whereby it is possible to make the cutting length small as compared with the case of the manufacturing method described in Patent Document 1. This allows enhancement of the cutting precision. Furthermore, it is possible to make the cutting length small and to use a cutting blade having a small thickness. It is thereby possible to reduce materials that are removed due to the cutting, so as to enhance the mass-productivity of the laminated piezoelectric ceramic element.

DESCRIPTION OF REFERENCE SYMBOLS 1, 3 Ceramic green sheet
2, 4 Internal electrode
2a, 4a Internal electrode
2b, 4b Internal electrode 2c, 4c Internal electrode
5 Ceramic green sheet
6 First laminated body
7 Second laminated body
8 Third laminated body
8a, 8b Side face
9, 10 Adhesive
11 Piezoelectric body
12, 13 Laminated piezoelectric body
13a, 13b Side face
14, 15 External electrode
16 Laminated piezoelectric ceramic element
21, 22 Adhesive sheet

BEST MODE FOR CARRYING OUT THE INVENTION

Hereinafter, specific embodiments of the present invention are described, with reference to the drawings, to demonstrate the present invention.

A laminated piezoelectric ceramic element manufacturing method according to an embodiment of the present invention will be described with reference to FIGS. 1 to 8.

In the present embodiment, first, a ceramic slurry containing a lead zirconate titanate (PZT) powder as a piezoelectric ceramic powder, a resin binder, and a dispersant is molded into a sheet, to obtain a ceramic green sheet. On this ceramic green sheet, an internal electrode pattern is printed which includes a plurality of internal electrodes each in a stripe-like shape, namely, a longitudinal rectangle. At the time of printing the internal electrode pattern, there is used a method for printing a conductive paste containing a metal powder such as an Ag—Pd powder on the above ceramic green sheet by screen printing or the like. However, printing of internal electrodes is not restricted to this method.

Next, the ceramic green sheet printed with the internal electrode pattern is punched out, and laminated inside a mold for first crimping. It is to be noted that in the present embodiment, the punched-out ceramic green sheet was made to have dimensions of 160 mm×160 mm×120 μm (thickness).

Figure 1:
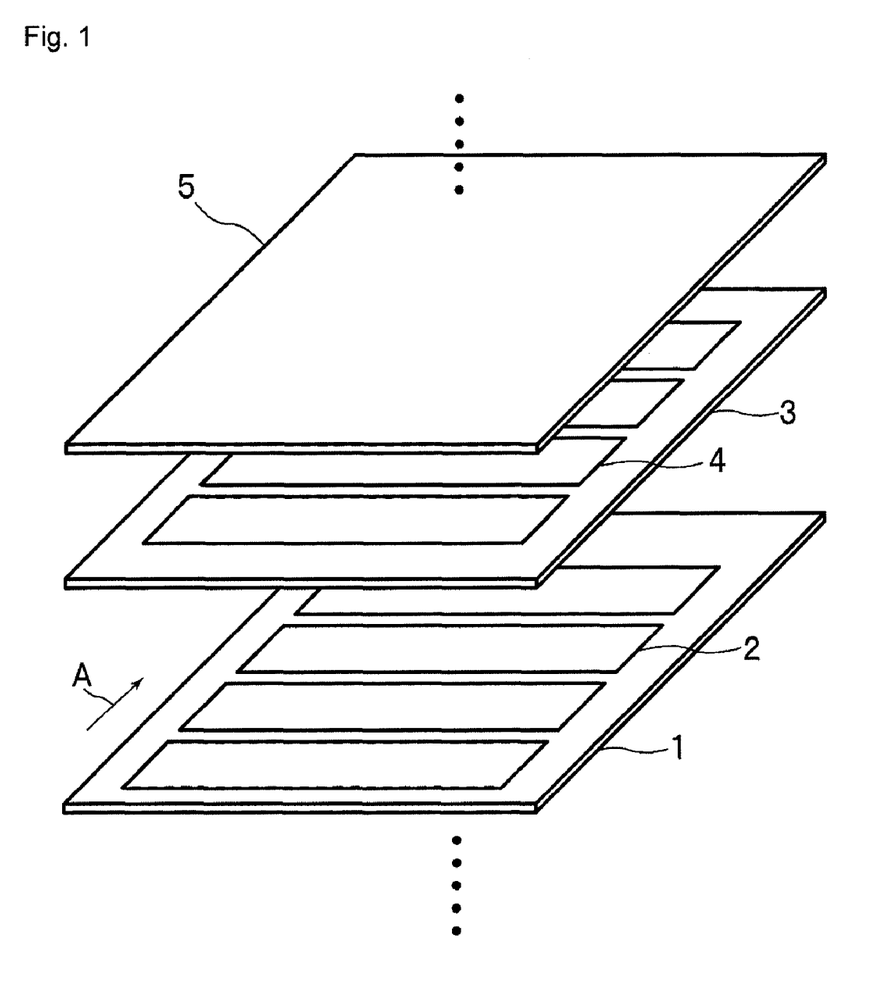
FIG. 1 is a perspective view for describing a step of obtaining a first laminated body in a manufacturing method according to an embodiment of the present invention.

As shown in FIG. 1, first and second ceramic green sheets 1, 3 were prepared as the mother ceramic green sheet. On the upper surface of the first mother ceramic green sheet 1, an internal electrode pattern having a plurality of stripe-like internal electrodes 2 is printed. On the second mother ceramic green sheet 3, an internal electrode pattern having a plurality of stripe-like internal electrodes 4 is printed. The positions of the internal electrodes 2 and the internal electrodes 4 are displaced in the direction of an arrow A of FIG. 1. The internal electrodes 2 and the internal electrodes 4 are drawn to different outer surface portions so as to form internal electrodes that are connected to different potentials in the laminated piezoelectric ceramic element to be ultimately obtained.

FIG. 1 shows a portion where two layers, the first mother ceramic green sheet 1 and the second mother ceramic green sheet 3, are alternately laminated, but 40 first mother ceramic green sheets 1 and 40 second mother ceramic green sheets 3 were laminated in practice to make the number of laminations 80. Further, above the portion where the first and second mother ceramic green sheets 1, 3 were laminated, one solid third mother ceramic green sheet 5 was laminated. A first laminated body as thus obtained was crimped by application of pressure of 100 MPa at a temperature of 50° C. with use of a rigid body press. The first laminated body thus obtained is shown in the perspective view of FIG. 2(a). After being crimped, the first laminated body has dimensions of 160 mm×160 mm×8 μm (thickness).

Figure 2A:
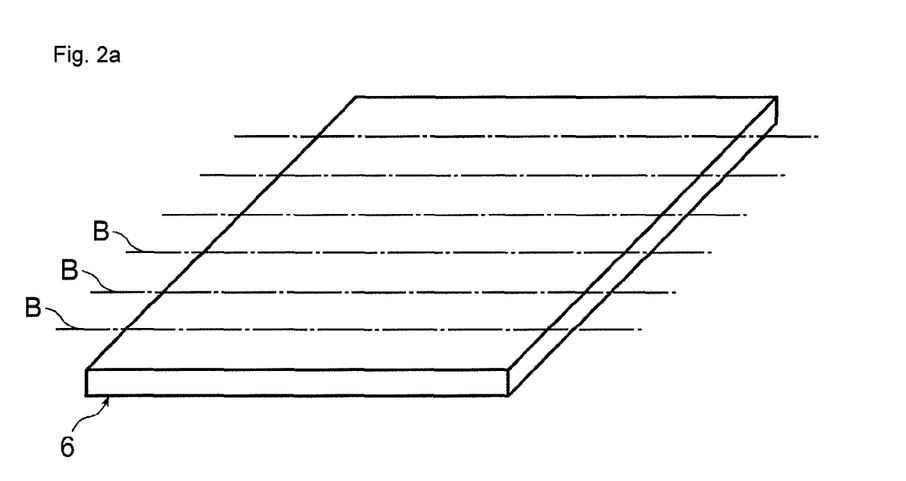
FIG. 2(a) is a perspective view of the first laminated body obtained in the embodiment of the present invention.

The first laminated body 6 has the shape of a square plate of 160 mm×160 mm×8 mm (thickness). However, the first laminated body 6 may have a rectangular plane shape, rather than a square plane shape.

Figure 2B:
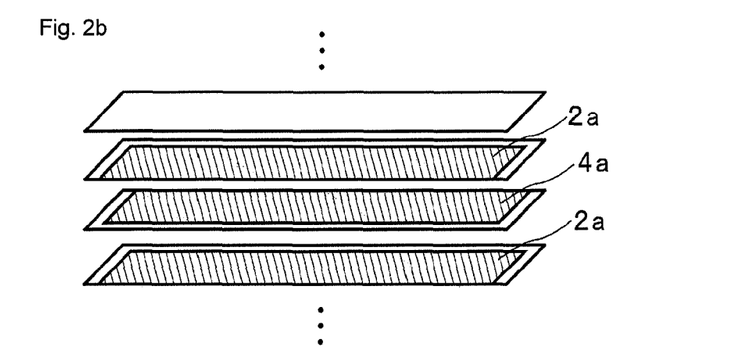
FIG. 2(b) is a schematically exploded perspective view for describing a laminated state of internal electrodes in a second laminated body.
Figure 3:
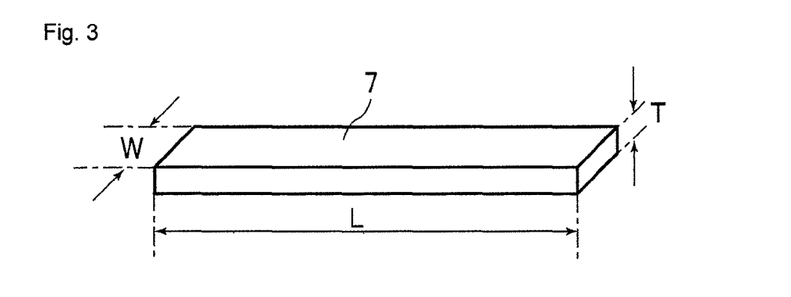
FIG. 3 is a perspective view showing the second laminated body obtained in the embodiment of the present invention.

Next, the first laminated body 6 is cut as indicated by alternate dashed lines B in FIG. 2(b). By this cutting, a second laminated body 7 shown in FIG. 3 is obtained.

The second laminated body 7 has the shape of a rectangular plate. The dimension in the length direction of the upper surface of the second laminated body 7 is referred to as a length-direction dimension L, a direction orthogonal to the length-direction dimension is taken as a width direction and a width-direction dimension is referred to as W, and a thickness-direction dimension is referred to as T. The width-direction dimension W is made equal to a width dimension of the laminated piezoelectric body to be ultimately obtained.

In the cutting step where the second laminated bodies 7 are obtained, the first laminated body 6 is cut in the laminating direction so as to obtain the second laminated bodies 7 having the width-direction dimension W. The cutting depth, namely the cutting length, at the time of this cutting is the thickness-direction dimension T corresponding to the thickness of the first laminated body 6. Therefore, the cutting with the cutting length being 8 mm can be performed with high precision with use of a cutting blade having a small thickness. Further, since the portion to be removed by the cutting is reduced at the time of obtaining the second laminated bodies 7 from the first laminated body 6, the number of obtained second laminated bodies 7 can be increased.

Moreover, the cutting along the alternate dashed lines B is performed in a direction parallel to the length direction of the stripe-like shapes of the first and second internal electrodes 2, 4 described above. In other words, as internal electrodes 2a, 4a laminated in the second laminated body 7 after the cutting are schematically shown in FIG. 2(b), the cutting is performed in a direction parallel to the length directions of the initial internal electrodes 2, 4.

As described above, the second laminated bodies 7 of 160 mm (L)×10 mm (W) and 8 mm (T) are obtained.

Figure 4:
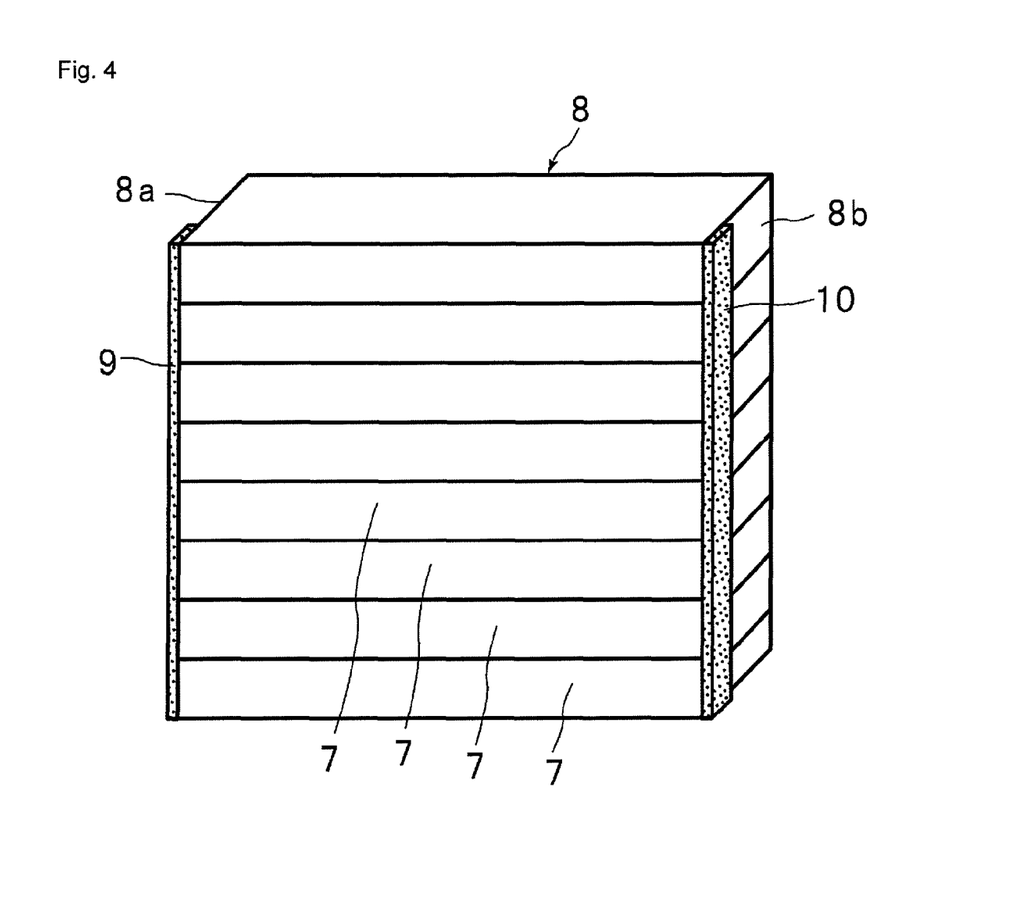
FIG. 4 is a perspective view showing a third laminated body obtained in the manufacturing method of the embodiment of the present invention.

Next, as shown in FIG. 4, a plurality of second laminated bodies 7 are laminated in the laminating direction of the second laminated bodies 7, to obtain a third laminated body 8.

Although it is schematically shown in FIG. 4, 13 second laminated bodies 7 were actually laminated to obtain the third laminated body 8. Therefore, the third laminated body 8 has a length L of 160 mm, a width W of 10 mm, and a laminating-direction dimension of 8×13=104 mm.

In order to temporarily bond the mutually adjacent second laminated bodies 7 in the third laminated body 8, adhesives 9, 10 were applied as joint materials respectively to a pair of mutually opposing side faces 8a, 8b of the third laminated body 8. The adhesives 9, 10 are provided so as to cross the mutually adjacent second laminated bodies 7, 7.

Although the adhesives 9, 10 are removed in advance of later-mentioned degreasing baking, an adhesive that is decomposed in a later-mentioned degreasing step or baking step may be used. Examples of the adhesives 9, 10 may include an epoxy-based adhesive.

Thereafter, the third laminated body 8 was crimped by isostatic pressing with application of pressure of 120 MPa at a temperature of 60° C. Thereby, a piezoelectric body 11 shown in FIG. 5 was obtained. This piezoelectric body 11 had a length L of 160 mm, a width W of 10 mm, and a laminating-direction dimension of 100 mm.

Figure 5:
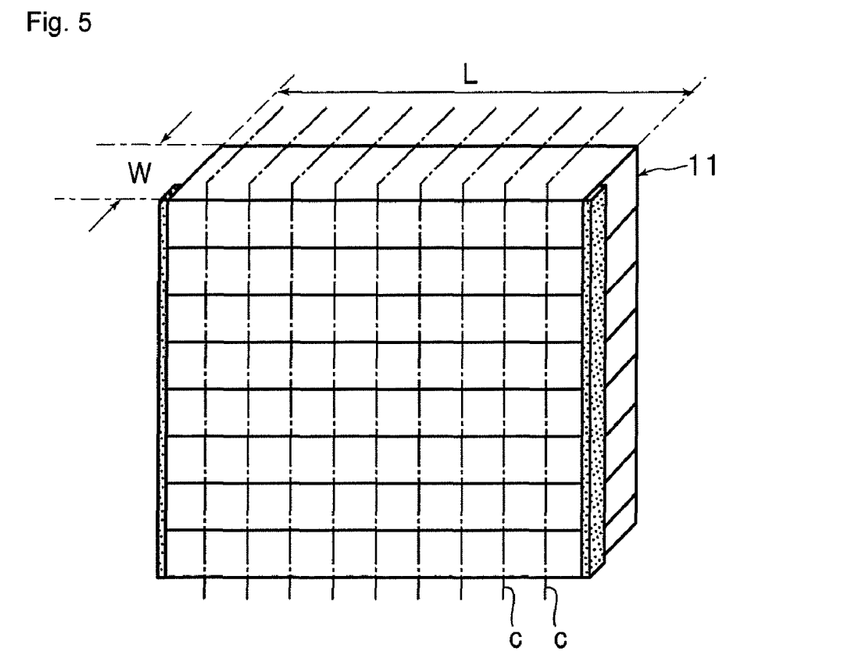
FIG. 5 is a perspective view for describing a step of crimping and then cutting the third laminated body.
Figure 6:
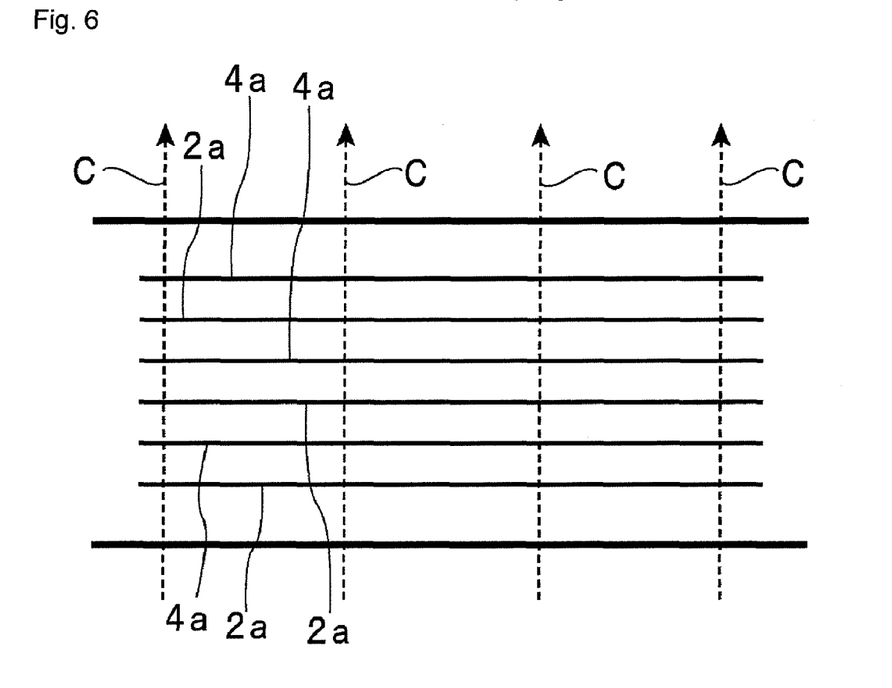
FIG. 6 is a diagrammatic front view for describing a step of cutting the third laminated body in the manufacturing method of the embodiment of the present invention.

Next, at positions indicated by the alternate dashed lines C of FIG. 5, the piezoelectric body 11 was cut with a dicing saw. At the time of cutting with the dicing saw, a cutting blade having a thickness of 0.3 mm was used, and the cutting was performed with an outline taken as a reference such that a distance between the alternate dashed lines C, C was 10 mm. At the time of the cutting, as schematically shown in FIG. 6, with an extending direction of the internal electrodes 2a, 4a taken as a reference, the cutting was performed in a direction orthogonal to that direction. This cutting direction along the alternate dashed lines C is a direction parallel to the width direction in the width-direction dimension W and in a direction orthogonal to the laminating direction. In such a manner, the laminated piezoelectric body 12 shown in FIG. 7(a) was obtained, having a width-direction dimension W of 10 mm, a lamination-direction dimension of 100 mm, and a dimension along a direction orthogonal to the width direction and the laminating direction, namely, a dimension between the alternate dashed lines C, C, of 10 mm.

Figure 7A:
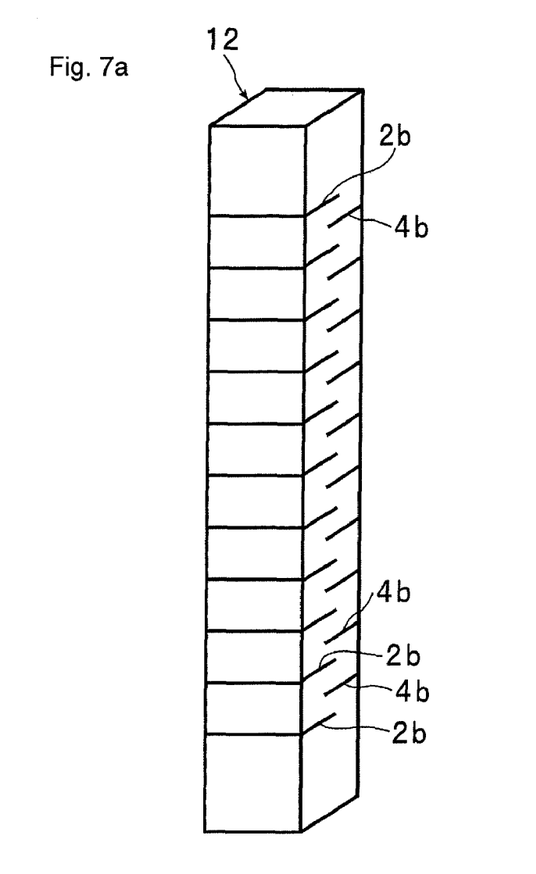
FIG. 7(a) is a perspective view showing a laminated piezoelectric body cut out from the third laminated body.
Figure 7B:
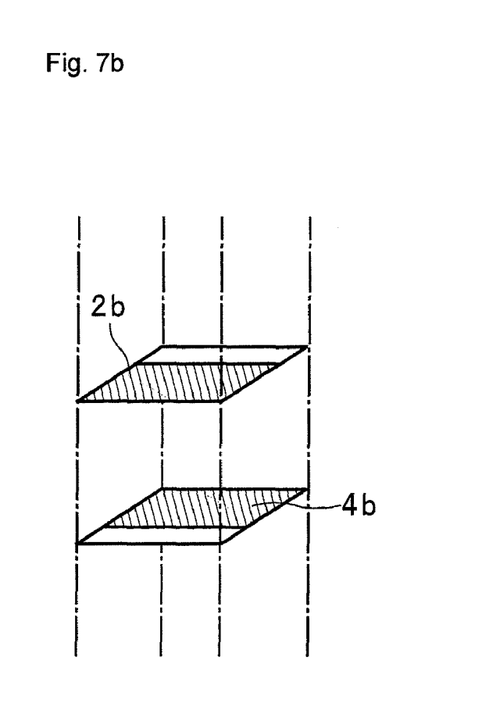
FIG. 7(b) is a schematic perspective view for describing a laminated state of first and second internal electrodes in the laminated piezoelectric body.
Figure 8:
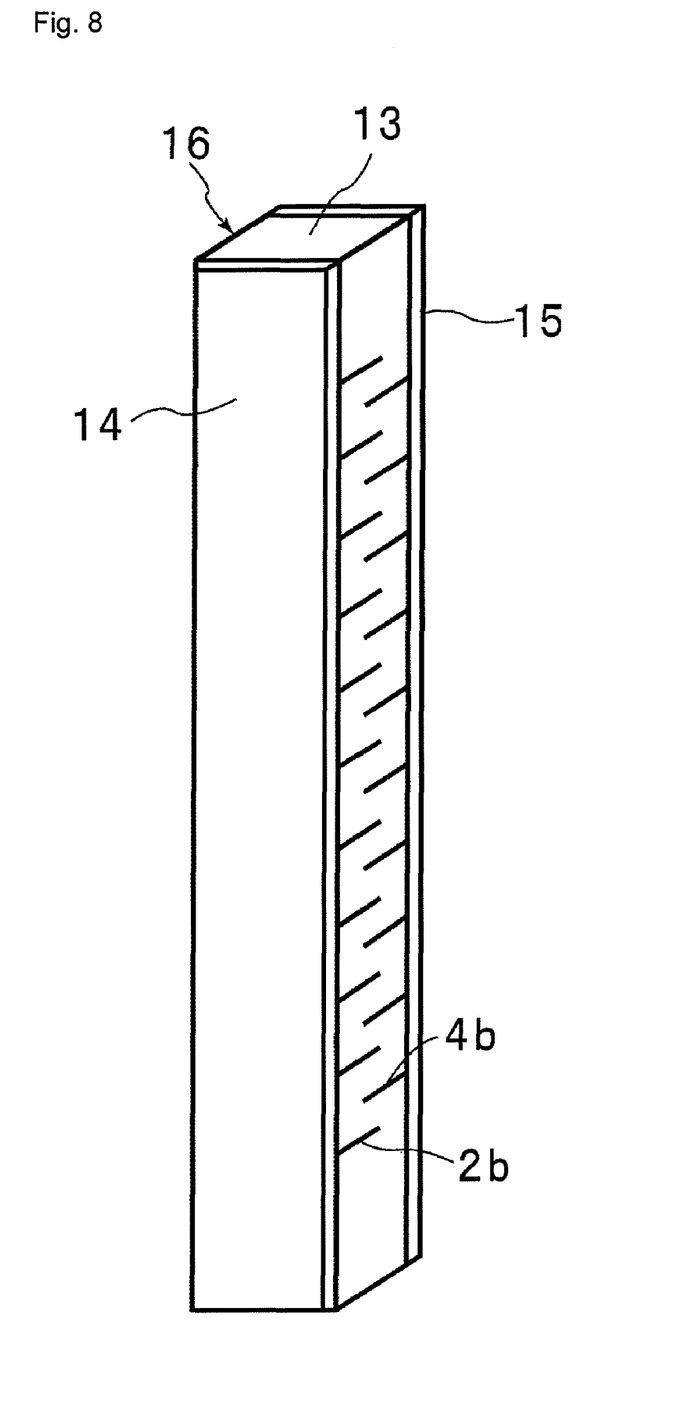
FIG. 8 is a perspective view showing a laminated piezoelectric ceramic element obtained in the manufacturing method of the embodiment of the present invention.

As schematically shown in FIG. 7(b), the first internal electrodes 2b and the second internal electrodes 4b obtained by the cutting in the laminated piezoelectric body 12 are alternately laminated throughout the piezoelectric body layers.

The laminated piezoelectric body 12 obtained as described above was heated, and a degreasing step to remove the binder in the ceramic green sheet was performed, and subsequently, the laminated piezoelectric body was further baked. In such a manner, the laminated piezoelectric body 13 after the baking shown in FIG. 8 was obtained. First and second external electrodes 14, 15 were formed on a pair of side faces 13a, 13b of the laminated piezoelectric body 13, to obtain a laminated piezoelectric ceramic element 16. The first and second external electrodes 14, 15 can be formed by a thin film forming method, such as application and baking of a conductive paste, vapor deposition, or sputtering, or an appropriate method such as application and curing of a' conductive adhesive.

In both cutting steps of the manufacturing method of the present embodiment: the step of cutting the first laminated body 6 to obtain the second laminated bodies 7; and the step of cutting the third laminated body 8 to obtain the laminated piezoelectric body, the cutting length is made not larger than the width-direction dimension of the ultimately laminated piezoelectric body. Therefore, it is possible to perform cutting with high precision and ease without the need to make the cutting length large.

Furthermore, since the cutting length can be made small, it is possible to conduct the cutting step with use of a cutting blade having a small thickness. It is thereby possible to make the cutting cost low at the time of cutting, so as to enhance the mass-productivity of the laminated piezoelectric body.

According to experiments conducted by the present inventors, it was confirmed that the cutting length can be made extremely small, one fifth to one fourth of the cutting length in the manufacturing method described in Patent Document 1, so that the precision at the time of cutting can be significantly enhanced. Further, it was also confirmed that the thickness of the cutting blade can also be made one third to one half of the thickness in the case of the manufacturing method described in Patent Document 1, so that the cutting cost can be made significantly low.

In addition, after the initial cutting step, the lamination step and the cutting step can be conducted while the laminated body remains having the ultimate width-direction dimension W, thereby allowing simplification of the lamination step and the cutting step. Further, it is not necessary to conduct a complicated positioning step. Accordingly, even in the case of increasing the number of internal electrode laminations, a laminated piezoelectric ceramic element excellent in reliability can be obtained with ease and high precision.

In the above embodiment, the first laminated body 6 was cut parallel to the length direction L of the stripe-like internal electrodes 2, 4 at the time of cutting the first laminated body 6 to obtain the second laminated bodies 7.

Figure 9:
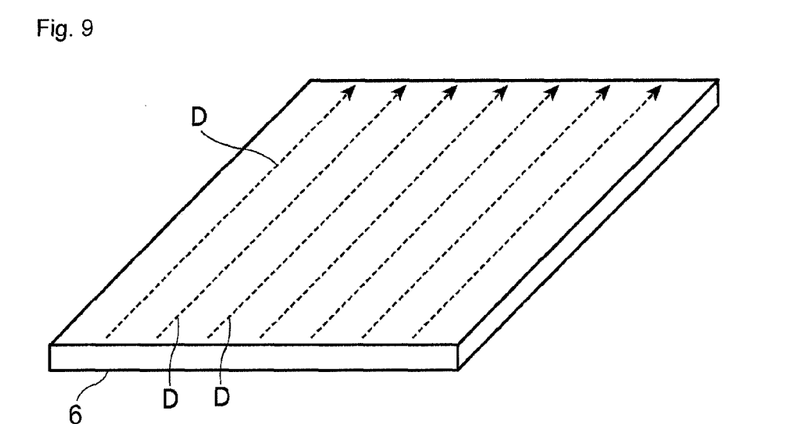
FIG. 9 is a perspective view for describing a step of cutting a first laminated body in a manufacturing method according to a modified example of the embodiment of the present invention.
Figure 10:
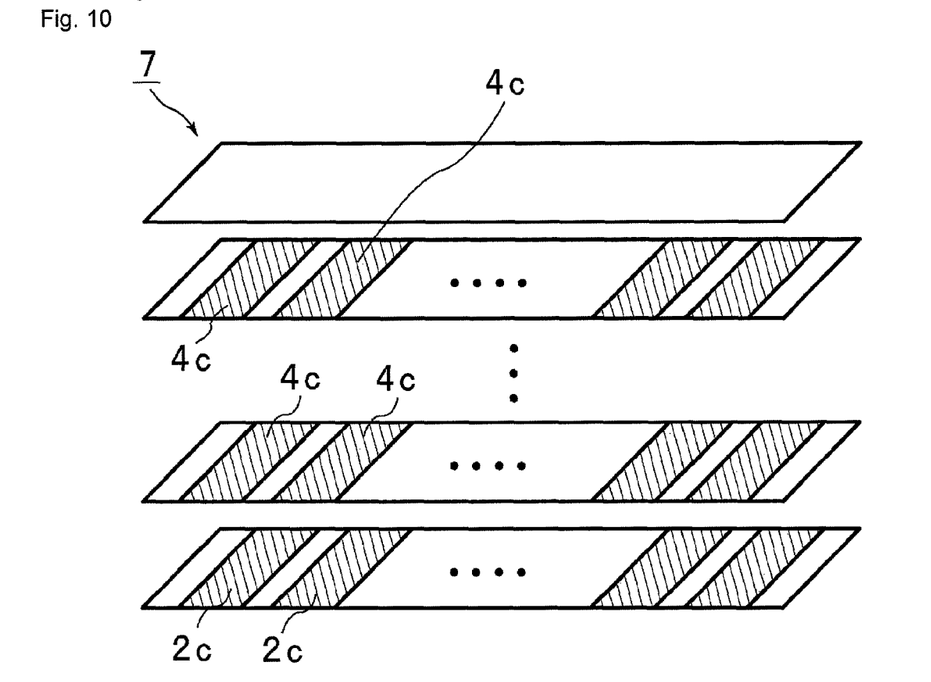
FIG. 10 is a diagrammatic exploded perspective view for describing a laminated state of internal electrodes in a second laminated body obtained by cutting along the cutting direction shown in FIG. 9.

However, as indicated by broken lines D in FIG. 9, the first laminated body 6 may be cut in a direction orthogonal to the length directions of the internal electrodes 2, 4, i.e., differently from the case of FIG. 2(a). In this case, in the obtained second laminated body 7, a plurality of internal electrodes 2c, 4c obtained by cutting the plurality of internal electrodes 2, 4 are respectively formed in respective height positions as indicated in FIG. 10 by an exploded perspective view. In this case, the upper and lower internal electrodes 2c, 4c are disposed to be displaced in the length direction of the second laminated body 7.

Figure 11:
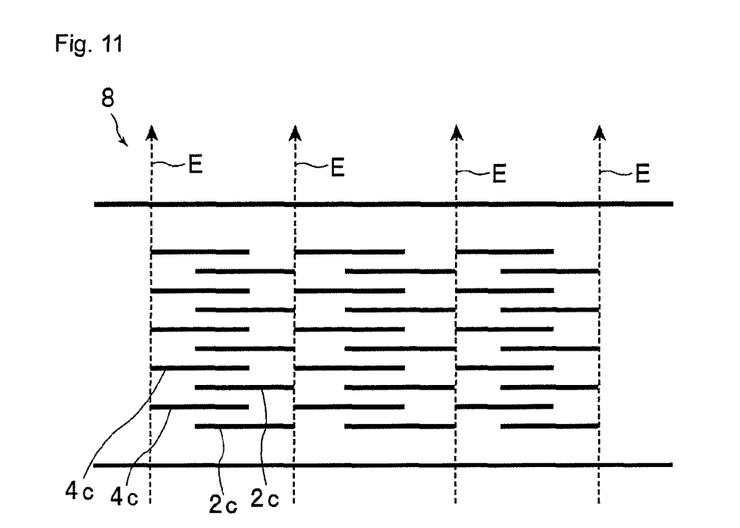
FIG. 11 is a diagrammatic plan view for describing a cutting direction at the time of cutting a third laminated body in the modified example of the manufacturing method of the embodiment of the present invention.

At the time of cutting the third laminated body 8 in the above embodiment, the cutting was performed along the alternate dashed lines C in the direction orthogonal to the extending directions of the internal electrodes 2a, 4a, whereas in the present modified example, as shown in FIG. 11, the third laminated body 8 may be cut as indicated by arrows E with the end portions of the internal electrodes 2c, 4c taken as targets. In the present modified example, the cutting is performed in the same manner as the other embodiment except that the cutting direction in the case of obtaining the second laminated bodies 7 is different and that the cutting is performed in such a manner as described above at the time of cutting the third laminated body 8. Accordingly, also in the present modified example, as in the above embodiment, the cutting length in the cutting step for obtaining the second laminated bodies 7 and the cutting step at the time of cutting the third laminated body 8 is a dimension not larger than W. Hence it is possible to make the cutting length small, so as to enhance the cutting precision. Accordingly, the cutting operation can be easily conducted. Further, it is possible to use a cutting blade having a small thickness, so as to make the cutting cost low.

Moreover, also in the present modified example, as in the above embodiment, complicated positioning at the time of lamination is not necessary, thereby even allowing simplification of the lamination step.

Figure 12:
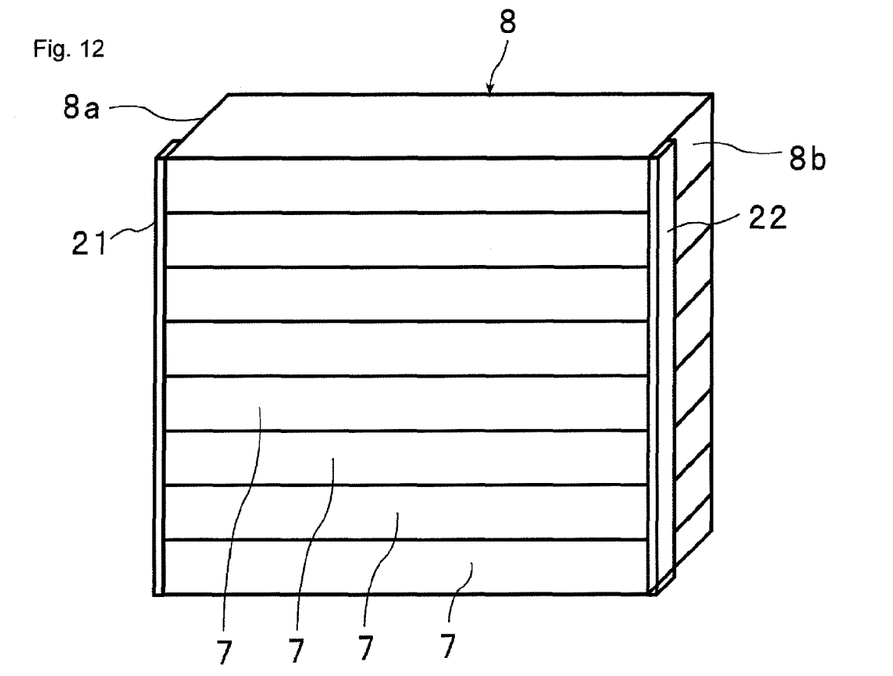
FIG. 12 is a perspective view showing a structure in which adhesive sheets are pasted to a third laminated body in another modified example of the manufacturing method of the present invention.

It is to be noted that although the adhesives 9, 10 were applied for temporarily bonding the plurality of second laminated bodies 7 in FIG. 4, adhesive sheets 21, 22 may be pasted as joint materials as shown in FIG. 12. In other words, the adhesive sheets 21, 22 may be pasted so as to cross the mutually adjacent second laminated bodies 7, to temporarily bond the mutually adjacent second laminated bodies 7. In place of the adhesive sheets 21, 22, a bonding sheet may also be used.

It should be noted that the adhesives 9, 10 and the adhesive sheets 21, 22 are desirably ones that decompose and are removed in the subsequent baking step. In that case, a step of removing the adhesive, the adhesive sheet, or the like, can be omitted. The adhesive, the adhesive sheet, or the like, may also be removed after the baking. Further, at the time of cutting the laminated piezoelectric body from the third laminated body 8, the portions of the side faces of the laminated body where the adhesives 9, 10 or the adhesive sheets 21, 22 are pasted may be removed.

Further, although the first and second external electrodes with the baked laminated piezoelectric body were formed in the foregoing embodiment, the first and second external electrodes may be provided on a laminated piezoelectric body before the baking.

Moreover, although the laminated piezoelectric ceramic element 16 obtained by the manufacturing method of the above embodiment is preferably used for the laminated piezoelectric actuator, it may also be used for another laminated piezoelectric ceramic element such as a piezoelectric resonator.

The invention claimed is:

1. A laminated piezoelectric ceramic element manufacturing method, comprising:

providing a first laminated body which includes a plurality of piezoelectric body layers of piezoelectric ceramic, and stripe shape internal electrodes disposed on at least one interface between adjacent piezoelectric body layers in the first laminated body;

cutting the first laminated body in a laminating direction so as to have a width-direction dimension corresponding to a width dimension of a laminated piezoelectric body to be ultimately obtained, to obtain a plurality of second laminated bodies having the width-direction dimension;

laminating two or more second laminated bodies in the laminating direction of the piezoelectric body layers, to obtain a third laminated body;

providing a joint material so as to join adjacent second laminated bodies in the third laminated body in order to temporarily bond the laminated second laminated bodies to one another;

cutting the third laminated body in the laminating direction and in a direction parallel to the width direction of the second laminated body, to obtain a laminated piezoelectric body; and baking the laminated piezoelectric body.

2. The laminated piezoelectric ceramic element manufacturing method according to claim 1, wherein the joint material is an adhesive.

3. The laminated piezoelectric ceramic element manufacturing method according to claim 1, wherein the joint material is an adhesive sheet or a bonding sheet.

4. The laminated piezoelectric ceramic element manufacturing method according to claim 1, wherein when cutting the first laminated body to obtain the plurality of second laminated bodies, the first laminated body is cut in a direction parallel to a length direction of one of the stripe shape internal electrodes so as to have a rectangular planar shape with a pair of opposed sides having the width-direction dimension.

5. The laminated piezoelectric ceramic element manufacturing method according to claim 4, wherein the joint material is an adhesive.

6. The laminated piezoelectric ceramic element manufacturing method according to claim 4, wherein the joint material is an adhesive sheet or a bonding sheet.

7. The laminated piezoelectric ceramic element manufacturing method according to claim 1, wherein when cutting the first laminated body to obtain the plurality of second laminated bodies, the first laminated body is cut in a direction orthogonal to a length direction of one of the stripe shape internal electrodes, so as to have a rectangular planar shape with a pair of opposed sides having the width-direction dimension.

8. The laminated piezoelectric ceramic element manufacturing method according to claim 7, wherein the joint material is an adhesive.

9. The laminated piezoelectric ceramic element manufacturing method according to claim 7, wherein the joint material is an adhesive sheet or a bonding sheet.

* * * * *